(12) United States Patent
Itasaka et al.

(10) Patent No.: US 9,660,581 B2
(45) Date of Patent: May 23, 2017

(54) OSCILLATION CIRCUIT, ELECTRONIC APPARATUS, MOVING OBJECT, AND METHOD OF ADJUSTING OSCILLATION CIRCUIT

(71) Applicant: SEIKO EPSON CORPORATION, Tokyo (JP)

(72) Inventors: Yosuke Itasaka, Tatsuno-machi (JP); Atsushi Kiyohara, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/013,620

(22) Filed: Feb. 2, 2016

(65) Prior Publication Data

US 2016/0241189 A1    Aug. 18, 2016

(30) Foreign Application Priority Data

Feb. 18, 2015   (JP) ................................. 2015-029614

(51) Int. Cl.
*H03B 5/36* (2006.01)
*H03B 5/04* (2006.01)
*H03L 1/02* (2006.01)

(52) U.S. Cl.
CPC .............. *H03B 5/362* (2013.01); *H03B 5/04* (2013.01); *H03B 5/368* (2013.01); *H03B 5/364* (2013.01); *H03B 5/366* (2013.01); *H03L 1/023* (2013.01); *H03L 1/028* (2013.01)

(58) Field of Classification Search
CPC ........ H03B 5/362; H03B 5/364; H03B 5/366; H03B 5/368; H03B 5/04; H03L 1/023; H03L 1/028
USPC ............................ 331/66, 116 R, 176, 177 R
See application file for complete search history.

(56) References Cited

U.S. PATENT DOCUMENTS

| | | | |
|---|---|---|---|
| 6,882,835 B2 * | 4/2005 | Oka .......................... | H03B 5/32 331/176 |
| 7,821,348 B2 | 10/2010 | Ishimaru et al. | |
| 2003/0067361 A1 * | 4/2003 | Takahashi ............... | H03L 1/025 331/176 |
| 2009/0189705 A1 | 7/2009 | Ishimaru et al. | |

FOREIGN PATENT DOCUMENTS

| JP | 2009-201097 A | 9/2009 |
|---|---|---|
| JP | 2012-222575 A | 11/2012 |

* cited by examiner

*Primary Examiner* — Richard Tan
(74) *Attorney, Agent, or Firm* — Oliff PLC

(57) ABSTRACT

An oscillation circuit includes a circuit for oscillation, a first frequency adjustment circuit for adjusting a frequency, and a first terminal. The oscillation circuit has a first mode in which the circuit for oscillation and the first frequency adjustment circuit are electrically connected to each other and the first frequency adjustment circuit and the first terminal are not electrically connected to each other, and a second mode in which the circuit for oscillation and the first frequency adjustment circuit operate and a terminal on a side where a signal of the first frequency adjustment circuit is output and the first terminal are electrically connected to each other.

18 Claims, 9 Drawing Sheets

OSCILLATION CIRCUIT, ELECTRONIC APPARATUS, MOVING OBJECT, AND METHOD OF ADJUSTING OSCILLATION CIRCUIT

BACKGROUND

1. Technical Field

The present invention relates to an oscillation circuit, an electronic apparatus, a moving object, and a method of adjusting an oscillation circuit.

2. Related Art

JP-A-2009-201097 discloses a technique with which miniaturization is realized by using an inspection terminal of a quartz crystal resonator as a terminal of an oscillator in a quartz crystal oscillator.

However, in the oscillator disclosed in JP-A-2009-201097, the inspection terminal of the quartz crystal resonator can also be used as the terminal of the oscillator, but the operation of an oscillation amplifier or a buffering amplifier may be stopped, and thus an operation state of the oscillator during inspection is different from a normal operation state thereof. For this reason, when the oscillator is made to perform a normal operation after the quartz crystal resonator is inspected, there is the possibility of a frequency of the oscillator deviating from a desired value.

SUMMARY

An advantage of some aspects of the invention is to provide an oscillation circuit capable of reducing a concern for a fluctuation in an oscillation frequency after adjustment, and a method of adjusting the oscillation circuit. Another advantage of some aspects of the invention is to provide an electronic apparatus and a moving object which use the oscillation circuit.

The invention can be implemented as the following forms or application examples.

Application Example 1

An oscillation circuit according to this application example includes a circuit for oscillation which is electrically connected to a resonator and oscillates the resonator, a first frequency adjustment circuit that adjusts a frequency of the circuit for oscillation, and a first terminal. The oscillation circuit has a first mode in which the circuit for oscillation and the first frequency adjustment circuit are electrically connected to each other and the first frequency adjustment circuit and the first terminal are not electrically connected to each other, and a second mode in which the circuit for oscillation and the first frequency adjustment circuit operate and a terminal on a side where a signal of the first frequency adjustment circuit is output and the first terminal are electrically connected to each other.

The oscillation circuit may be a portion or the entirety of any of various oscillation circuits such as a pierced oscillation circuit, an inverter type oscillation circuit, a Colpitts oscillation circuit, and a Hartley oscillation circuit.

For example, the second mode may be an operation mode for adjusting the frequency of the circuit for oscillation, and the first mode may be an operation mode (for example, a normal operation mode) in which the circuit for oscillation having a frequency adjusted in the second mode is oscillated.

According to the oscillation circuit of this application example, an oscillation frequency can be adjusted on the basis of an output signal of the first frequency adjustment circuit which is output from the first terminal in the second mode in a state where the circuit for oscillation and the first frequency adjustment circuit operate, and thus it is possible to reduce a concern for a fluctuation in the oscillation frequency in the first mode after the adjustment.

Application Example 2

The oscillation circuit according to the application example may further include an output circuit that has a signal which is output from the circuit for oscillation and is input thereto, to thereby output an oscillation signal. The output circuit may operate in the first mode and the second mode.

According to the oscillation circuit of this application example, since an oscillation frequency can be adjusted on the basis of an output signal of the first frequency adjustment circuit which is output from the first terminal in the second mode in a state where the output circuit operates similar to in the first mode, there is a small difference in noise or heat generated from the output circuit in the first mode and the second mode, and thus it is possible to reduce a concern for a fluctuation in the oscillation frequency in the first mode after the adjustment.

Application Example 3

The oscillation circuit according to the application example may further include a second terminal that is electrically connected to a terminal on an output side of the output circuit.

According to the oscillation circuit of this application example, an oscillation frequency can be adjusted more accurately while directly measuring a frequency (oscillation frequency) of an oscillation signal which is output from the second terminal in the second mode, and thus it is possible to further reduce a concern for a fluctuation in the oscillation frequency in the first mode after the adjustment.

Application Example 4

The oscillation circuit according to the application example may further include a second frequency adjustment circuit for adjusting a frequency of the circuit for oscillation, and a voltage generation circuit that is capable of variably setting a voltage to be output. In the first mode, the first terminal and the second frequency adjustment circuit may be electrically connected to each other, and the second frequency adjustment circuit and the circuit for oscillation may be electrically connected to each other. In the second mode, the first terminal and the second frequency adjustment circuit may not be electrically connected to each other, and the voltage generation circuit and the circuit for oscillation may be electrically connected to each other.

According to the oscillation circuit of this application example, since a voltage generated by the voltage generation circuit is input to the circuit for oscillation in the second mode instead of an output voltage of the second frequency adjustment circuit which is input to the circuit for oscillation in the first mode, a difference in the state of the circuit for oscillation between the first mode and the second mode can be reduced, and thus it is possible to reduce a concern for a fluctuation in the oscillation frequency in the first mode after the oscillation frequency is adjusted in the second mode.

Application Example 5

The oscillation circuit according to the application example may further include a temperature-sensitive element. The first frequency adjustment circuit may adjust a frequency of the circuit for oscillation on the basis of a signal which is output from the temperature-sensitive element.

According to the oscillation circuit of this application example, since frequency-temperature characteristics can be adjusted on the basis of an output signal of the first frequency adjustment circuit which is output from the first terminal in the second mode in the same state as that in the first mode, and thus it is possible to reduce a concern for a fluctuation in the frequency-temperature characteristics in the first mode after the adjustment.

Application Example 6

An electronic apparatus according to this application example includes the oscillation circuit according to any one of the above-mentioned application examples.

Application Example 7

A moving object according to this application example includes the oscillation circuit according to any one of the above-mentioned application examples.

According to these application examples, the oscillation circuit capable of reducing a concern for a fluctuation in an oscillation frequency after adjustment can be used, and thus it is possible to realize the electronic apparatus and the moving object which have high reliability.

Application Example 8

A method of adjusting an oscillation circuit according to this application example is a method of adjusting an oscillation circuit including a circuit for oscillation which is electrically connected to a resonator and oscillates the resonator, a first frequency adjustment circuit that adjusts a frequency of the circuit for oscillation, and a first terminal, the oscillation circuit having a first mode in which the circuit for oscillation and the first frequency adjustment circuit are electrically connected to each other and the first frequency adjustment circuit and the first terminal are not electrically connected to each other, and a second mode in which the circuit for oscillation and the first frequency adjustment circuit operate and a terminal on a side where a signal of the first frequency adjustment circuit is output and the first terminal are electrically connected to each other, the method including setting the oscillation circuit to be in the second mode, and adjusting the oscillation circuit on the basis of the signal of the first frequency adjustment circuit which is output from the first terminal in a state where the oscillation circuit is set to be in the second mode.

According to the method of adjusting an oscillation circuit of this application example, an oscillation frequency can be adjusted on the basis of an output signal of the first frequency adjustment circuit which is output from the first terminal in the second mode in a state where the circuit for oscillation and the first frequency adjustment circuit operate, and thus it is possible to reduce a concern for a fluctuation in the oscillation frequency in the first mode after the adjustment.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference the accompanying drawings. Meanwhile, the embodiments described below are not unduly limited to the disclosure of the invention described in the appended claims. In addition, all the configurations described below are not necessarily essential components of the invention.

1. Oscillator

Configuration of Oscillator

Figure 1:
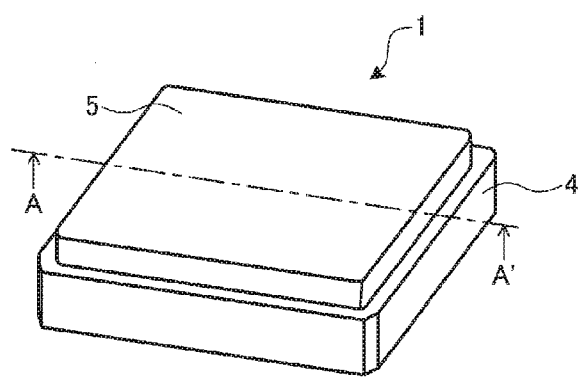
FIG. 1 is a perspective view of an oscillator according to the present embodiment.
Figure 2A:
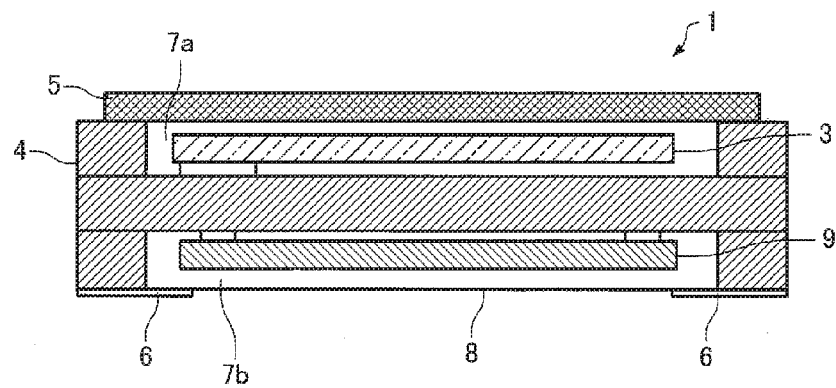
FIG. 2A is a cross-sectional view of the oscillator.
Figure 2B:
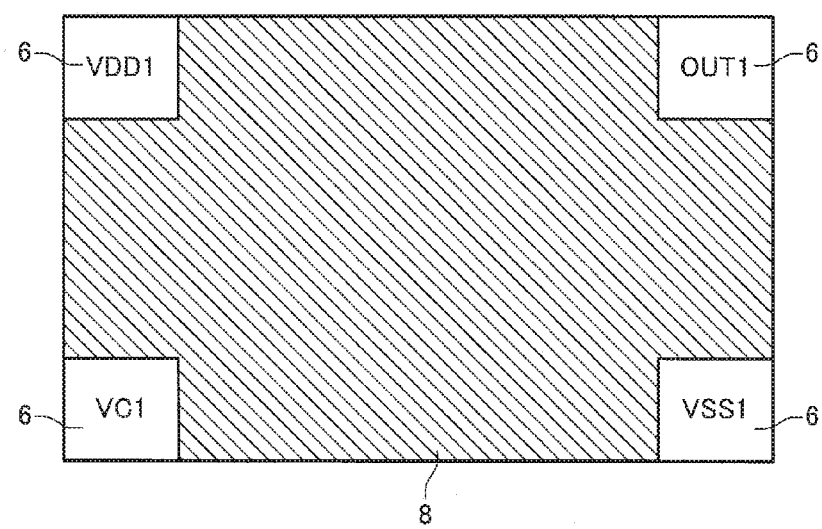
FIG. 2B is a bottom view of the oscillator.

FIGS. 1, 2A and 2B illustrate the structure of an oscillator according to the present embodiment. FIG. 1 is a perspective view of the oscillator according to the present embodiment, FIG. 2A is a cross-sectional view taken along line A-A' of FIG. 1. In addition, FIG. 2B is a bottom view of the oscillator according to the present embodiment.

As illustrated in FIGS. 1 and 2A, an oscillator 1 according to the present embodiment is configured to include an electronic component 9 including an oscillation circuit 2 of FIGS. 5A to 5B to be described later, a resonator 3, a package 4, a lid 5, an external terminal (external electrode) 6, and a sealing member 8.

Examples of the resonator 3 include a surface acoustic wave (SAW) resonator, an AT-cut quartz crystal resonator, an SC-cut quartz crystal resonator, a tuning fork type quartz crystal resonator, other piezoelectric resonators, a micro electro mechanical systems (MEMS) resonator, and the like. Examples of a substrate material of the resonator 3 include a piezoelectric material such as piezoelectric single crystal, such as quartz crystal, lithium tantalate or lithium niobate, or piezoelectric ceramics such as lead zirconate titanate, a silicon semiconductor material, and the like. As excitation means of the resonator 3, means using a piezoelectric effect may be used, or electrostatic driving using Coulomb force may be used. Meanwhile, the resonator 3 according to the present embodiment is configured as a chip-shaped element having an individualized substrate material. However, the invention is not limited thereto, and a resonator device in which a chip-shaped element is sealed in a container may be used.

The package 4 is a container for accommodating the electronic component 9 and the resonator 3. Specifically, the package 4 is provided with two concave portions on opposite surfaces. One of the concave portions is covered with the lid 5 to thereby configure an accommodation chamber 7a, and the other is covered with the sealing member 8 to thereby configure an accommodation chamber 7b. The resonator 3 is accommodated in the accommodation chamber 7a, and the electronic component 9 is accommodated in the accommodation chamber 7b. A wiring, not shown in the drawing, for electrically connecting two terminals (a terminal XO and a terminal XI of FIG. 3 to be described later) of the oscillation circuit 2 and two terminals of the resonator 3 is provided inside the package 4 or on the surface of the concave portion. In addition, a wiring, not shown in the drawing, for electrically connecting each terminal of the oscillation circuit 2 and each corresponding external terminal 6 is provided inside the package 4 or on the surface of the concave portion.

As illustrated in FIG. 2B, in the oscillator 1 according to the present embodiment, four external terminals 6 of an external terminal VDD1 which is a power supply terminal, an external terminal VSS1 which is a ground terminal, an external terminal VC1 which is a terminal to which a signal for controlling the electronic component 9 is input, and an external terminal OUT1 which is an output terminal are provided on the bottom face (back face of the package 4) thereof. A power voltage is supplied to the external terminal VDD1, and the external terminal VSS1 is grounded.

Figure 3:
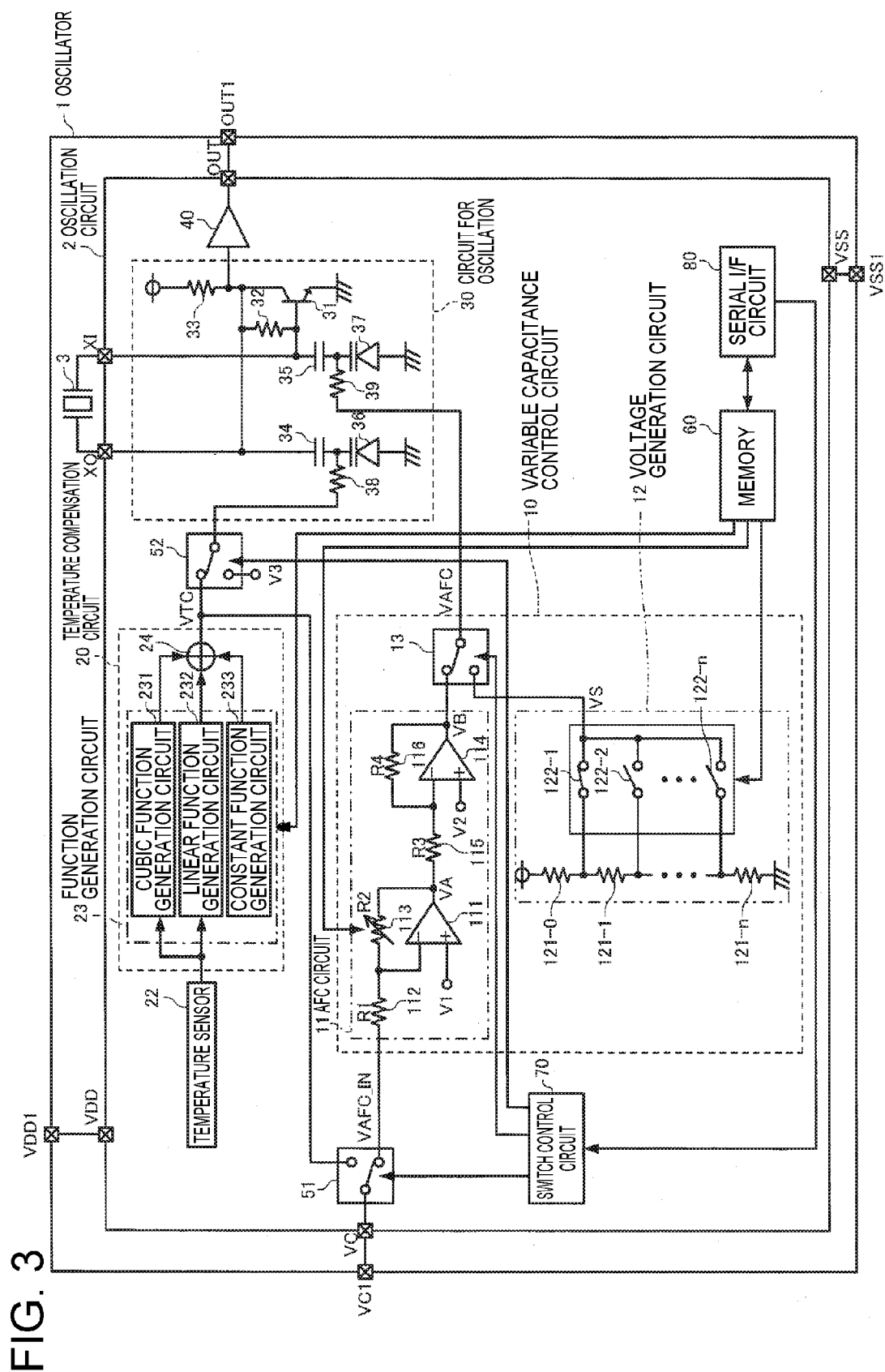
FIG. 3 is a functional block diagram of the oscillator according to the present embodiment.

FIG. 3 is a functional block diagram of the oscillator 1 according to the present embodiment. As illustrated in FIG. 3, the oscillator 1 according to the present embodiment is an oscillator including the oscillation circuit 2 and the resonator 3, and the oscillation circuit 2 and the resonator 3 are accommodated in the package 4.

The oscillation circuit 2 is provided with a terminal VDD which is a power supply terminal, a terminal VSS which is a ground terminal, a terminal OUT (example of a second terminal) which is an output terminal, a terminal VC (example of a first terminal) which is a terminal to which a signal for controlling a frequency is input, and terminals XI and XO which are terminals for connection to the resonator 3. The terminal VDD, the terminal VSS, the terminal OUT, and the terminal VC are exposed from the surface of the electronic component 9 (see FIG. 1) which is an IC chip, and are connected to the external terminals VDD1, VSS1, OUT1, and VC1 provided in the package 4, respectively. In addition, the terminal XI is connected to one end (one terminal) of the resonator 3, and the terminal XO is connected to the other end (the other terminal) of the resonator 3.

In the present embodiment, the oscillation circuit 2 is configured to include a variable capacitance control circuit 10, a temperature compensation circuit 20 (example of a first frequency adjustment circuit), a temperature sensor 22, a circuit for oscillation 30, an output circuit 40, a three-terminal switch 51, a three-terminal switch 52, a memory 60, a switch control circuit 70, and an interface (I/F) circuit 80. Meanwhile, the oscillation circuit 2 according to the present embodiment may have a configuration in which some of components are omitted or changed, or may have a configuration in which other components are added.

The variable capacitance control circuit 10 is configured to include an automatic frequency control (AFC) circuit 11 (example of a second frequency adjustment circuit), a voltage generation circuit (voltage selection circuit) 12, and a three-terminal switch 13.

The AFC circuit 11 is a circuit for adjusting a frequency of the circuit for oscillation 30, and is configured to include an arithmetic amplifier 111, a resistor 112 having a resistance value of R1, a variable resistor 113 having a resistance value of R2, an arithmetic amplifier 114, a resistor 115 having a resistance value of R3, and a resistor 116 having a resistance value of R4.

The resistor 112 is connected between a third terminal of the three-terminal switch 51 and an inverting input terminal (−terminal) of the arithmetic amplifier 111, and the variable resistor 113 is connected between the inverting input terminal (−terminal) of the arithmetic amplifier 111 and an output terminal. In addition, a constant voltage V1 is input to a non-inverting input terminal (+terminal) of the arithmetic amplifier 111.

The resistor 115 is connected between an output terminal of the arithmetic amplifier ill and an inverting input terminal (−terminal) of the arithmetic amplifier 114, and the resistor 116 is connected between the inverting input terminal (−terminal) of the arithmetic amplifier 114 and an output terminal. In addition, a constant voltage V2 is input to a non-inverting input terminal (+terminal) of the arithmetic amplifier 114, and the output terminal of the arithmetic amplifier 114 is connected to a first terminal of the three-terminal switch 13.

The resistance value R2 of the variable resistor 113 is a resistance value depending on a gain adjustment value stored in the memory 60.

In the AFC circuit 11 configured in such a manner, when an input voltage is set to be VAFC_IN, an output voltage VA of the arithmetic amplifier 111 is expressed as the following Expression (1).

$$VA = V1 - \frac{R2 \cdot (VAFC\_IN - V1)}{R1} \quad (1)$$

In addition, an output voltage VB of the arithmetic amplifier 114 is expressed as the following Expression (2).

$$VB = V2 - \frac{R4 \cdot (VA - V2)}{R3} \quad (2)$$

The voltage generation circuit 12 is configured to include n+1 resistors 121-0 to 121-n and n two-terminal switches 122-1 to 122-n.

The n+1 resistors 121-0 to 121-n are connected to each other in series in this order between a power supply and a ground.

In each two-terminal switch 122-k (k=1 to n), a first terminal is connected to a connection point between a resistor 121-(k−1) and a resistor 121-k, and a second terminal is connected to a second terminal of the three-terminal switch 13.

Only one of the n two-terminal switches 122-1 to 122-n is set to be in an on-state (state where a first terminal and a second terminal are electrically connected to each other) in accordance with a selection value stored in the memory 60, and the others are set to be in an off-state (state where a first terminal and a second terminal are electrically cut off). Accordingly, an output voltage (voltage supplied to the second terminal of the three-terminal switch 13) VS of the voltage generation circuit 12 has a voltage value depending on a selection value stored in the memory 60.

The three-terminal switch 13 is set to be in either a first state where the first terminal and a third terminal are electrically connected to each other or a second state where the second terminal and the third terminal are electrically connected to each other, in response to a control signal from the switch control circuit 70.

The temperature sensor 22 is a temperature-sensitive element that outputs a signal (for example, a voltage depending on temperature) depending on the ambient temperature thereof.

The temperature compensation circuit 20, which is a circuit for adjusting the frequency of the circuit for oscillation 30, is configured to include a function generation circuit 23 and an adder 24, and adjusts the frequency of the circuit for oscillation 30 on the basis of a signal which is output from the temperature sensor 22.

In the present embodiment, it is assumed that frequency-temperature characteristics of the resonator 3 can be approximated by a cubic expression using a temperature as a variable, and the function generation circuit 23 is configured to include a cubic function generation circuit 231, a linear function generation circuit 232, and a constant function generation circuit 233.

The cubic function generation circuit 231 has an input terminal connected to an output terminal of the temperature sensor 22, and generates and outputs a voltage of a cubic function depending on a cubic coefficient stored in the memory 60 using an output voltage of the temperature sensor 22 as a variable.

The linear function generation circuit 232 has an input terminal connected to the output terminal of the temperature sensor 22, and generates and outputs a voltage of a linear function depending on a linear coefficient stored in the memory 60 using an output voltage of the temperature sensor 22 as a variable.

The constant function generation circuit 233 generates and outputs a constant voltage depending on a constant coefficient (constant) which is stored in the memory 60.

The adder 24 adds up an output voltage of the cubic function generation circuit 231, an output voltage of the linear function generation circuit 232, and an output voltage of the constant function generation circuit 233, and outputs the added-up voltages. An output terminal of the adder 24 is connected to a second terminal of the three-terminal switch 51 and a first terminal of the three-terminal switch 52.

The circuit for oscillation 30 is connected to the terminal XO and the terminal XI, and oscillates the resonator 3. In an example of FIG. 3, the circuit for oscillation 30 is configured to include an NPN-type bipolar transistor 31, resistors 32 and 33, capacitors 34 and 35, a varactor (variable capacitance diode) 36, a varactor 37, a resistor 38, and a resistor 39.

In the bipolar transistor 31, a base terminal is connected to the terminal XI, a collector terminal is connected to the terminal XO, and an emitter terminal is grounded.

The resistor 32 is connected to the base terminal and the collector terminal of the bipolar transistor 31, and the resistor 33 is connected between a power supply and the collector terminal of the bipolar transistor 31.

The capacitor 34 is connected between the collector terminal of the bipolar transistor 31 and a cathode terminal of the varactor 36, and the capacitor 35 is connected between the base terminal of the bipolar transistor 31 and a cathode terminal of the varactor 37.

An anode terminal of the varactor 36 and an anode terminal of the varactor 37 are grounded.

The resistor 38 is connected between a third terminal of the three-terminal switch 52 and the cathode terminal of the varactor 36, and the resistor 39 is connected between a third terminal of the three-terminal switch 13 and the cathode terminal of the varactor 37.

The circuit for oscillation 30 configured in this manner amplifies an output signal of the resonator 3 which is input from the terminal XI by using the bipolar transistor 31 as an amplification element, and supplies the amplified signal as an input signal of the resonator 3 through the terminal XO. Meanwhile, the circuit for oscillation 30 may be realized using a PNP-type bipolar transistor, a field effect transistor (FET), a metal oxide semiconductor field effect transistor (MOSFET), a thyristor, or the like as an amplification element.

A signal of the collector terminal of the bipolar transistor 31 which is an output signal of the circuit for oscillation 30 is input to the output circuit 40, and an output signal of the output circuit 40 is output to the outside from the terminal OUT1 through the terminal OUT.

In the three-terminal switch 51, a first terminal is connected to the terminal VC, a second terminal is connected to an output terminal (output terminal of the temperature compensation circuit 20) of the adder 24, and a third terminal is connected to one terminal of the resistor 112.

The three-terminal switch 51 is set to be in either a first state where the first terminal and the third terminal are electrically connected to each other or a second state where the first terminal and the second terminal are electrically connected to each other, in response to a control signal from the switch control circuit 70.

In the three-terminal switch 52, a first terminal is connected to the output terminal of the adder 24, a constant voltage V3 is input to a second terminal, and a third terminal is connected to one terminal of the resistor 38.

The three-terminal switch 52 is set to be in either a first state where the first terminal and the third terminal are electrically connected to each other or a second state where the second terminal and the third terminal are electrically connected to each other, in response to a control signal from the switch control circuit 70.

The switch control circuit 70 generates a control signal for controlling each of the three-terminal switch 51, the three-terminal switch 52, and the three-terminal switch 13 in accordance with a set mode.

The interface (I/F) circuit 80 determines whether a voltage of the terminal VDD is higher or lower than a threshold value. When the voltage of the terminal VDD is higher than the threshold value, the I/F circuit receives a clock signal SCLK which is externally input from the terminal VC and a data signal DATA which is externally input from the terminal OUT, reads and writes data from and in the memory 60, or sets a mode of the oscillation circuit 2 in a resistor not shown in the drawing.

The memory 60, which is a storage unit for storing various pieces of control data, may be any of various rewritable non-volatile memories such as an electrically erasable programmable read-only memory (EEPROM) or a flash memory, and may be configured to include a non-volatile memory and any of various volatile memories such as a dynamic random access memory (DRAM) or a static random access memory (SRAM).

Mode of Oscillation Circuit

Figure 4:
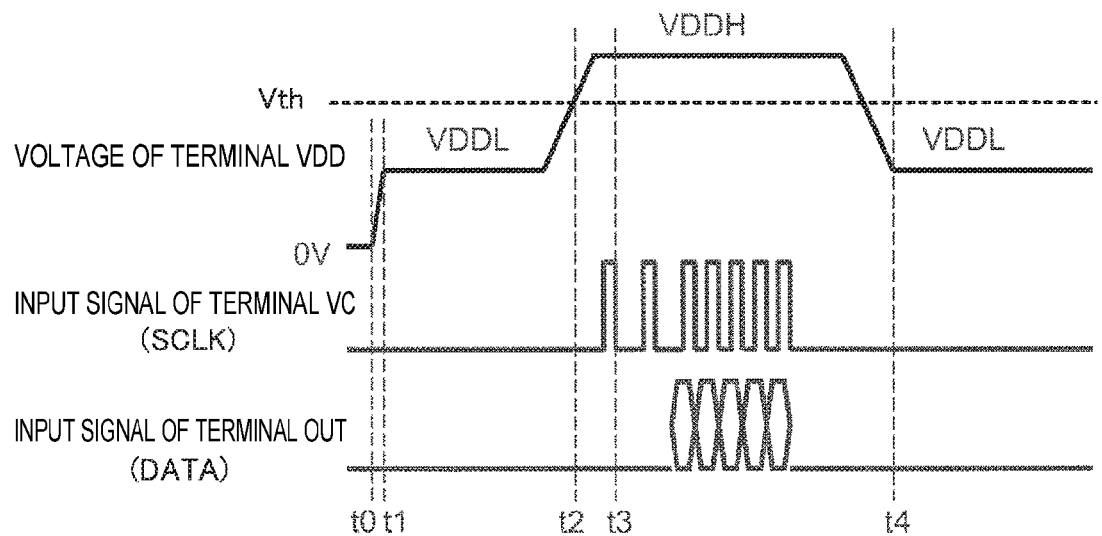
FIG. 4 is a timing chart illustrating a mode switching operation.

In the present embodiment, the oscillation circuit 2 is set to be in a normal operation mode when a power supply of the oscillator 1 is turned on (when the terminal VDD rises to a desired voltage from 0 V). In addition, the oscillation circuit can be switched to any of a plurality of modes including a temperature compensation adjustment mode and a resonator characteristic measurement mode through the interface (I/F) circuit 80. FIG. 4 is a timing chart illustrating the mode switching operation. In FIG. 4, a horizontal axis corresponds to time, and a vertical axis corresponds to a voltage. In the timing chart of FIG. 4, a voltage of the terminal VDD (external terminal VDD1 of the oscillator 1), the clock signal SCLK which is input from the terminal VC (external terminal VC1 of the oscillator 1), and the data signal DATA which is input from the terminal OUT (external terminal OUT1 of the oscillator 1) are shown.

In an example illustrated in FIG. 4, the voltage of the terminal VDD is set to be 0 V at time t0, is set to be a voltage VDDL at time t1, and is set to be a reference value Vth at time t2, and then rises to a voltage VDDH. Communication is enabled at time t3 which is a fall time of a first pulse of the clock signal SCLK which is input during a period in which the voltage of the terminal VDD is VDDH. The next pulse of the clock signal SCLK is a pulse for setting a test mode, and a type of test mode is selected in accordance with a 5-bit data signal DATA which is input in synchronization with the subsequent five pulses. Transition to a test mode selected is performed at time t4 when the voltage of the terminal VDD returns to VDDL. The oscillation circuit 2 can be set to be in the selected test mode by setting the 5-bit data signal DATA to be a predetermined value.

In the normal operation mode (example of a first mode), as illustrated in FIG. 3, the three-terminal switch 13 is set to be in a first state where a first terminal and a third terminal are electrically connected to each other, the three-terminal switch 51 is set to be in the first state where the first terminal and the third terminal are electrically connected to each other, and the three-terminal switch 52 is set to be in the first state where the first terminal and the third terminal are electrically connected to each other.

Accordingly, in the normal operation mode, an output voltage VTC of the temperature compensation circuit 20 which is generated on the basis of an output voltage of the temperature sensor 22 is applied to the cathode terminal of the varactor 36, and thus frequency-temperature characteristics of the resonator 3 are corrected (temperature compensation). In addition, an output voltage VB of the AFC circuit 11 which is generated on the basis of a voltage of the terminal VC is applied to the cathode terminal of the varactor 37 as VAFC, and thus an oscillation frequency is controlled. That is, the oscillator 1 according to the present embodiment is a voltage control type temperature compensation oscillator. When Expression (1) is substituted into Expression (2) to arrange the resultant with the relations of, for example, V2=V1 and R3=R4, VAFC in the normal operation mode is expressed as the following Expression (3).

$$VAFC = VB = V1 + \frac{R2}{R1}(VAFC\_IN - V1) \quad (3)$$

As expressed as Expression (3), a gain of the AFC circuit 11 is R2/R1, and VAFC is controlled by VAFC_IN, that is, a voltage of the terminal VC.

Figure 6:
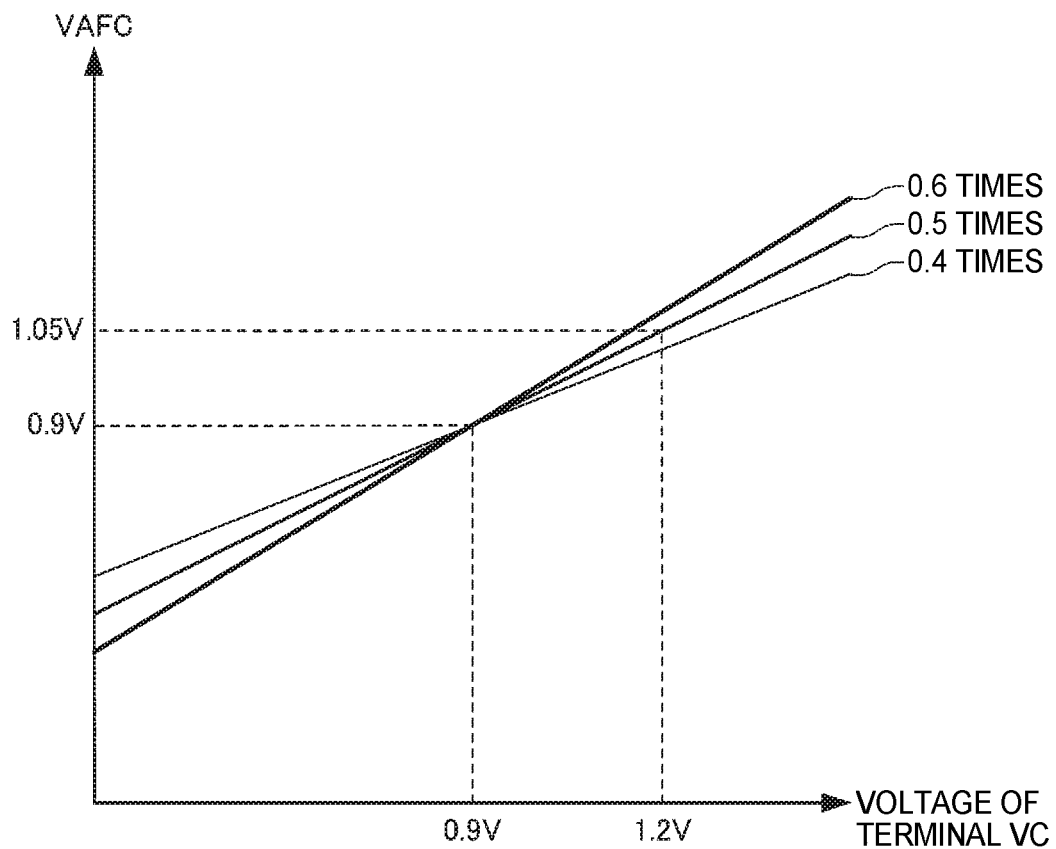
FIG. 6 is a graph illustrating a relationship between a voltage and a voltage VAFC of a terminal VC1.

FIG. 6 is a diagram illustrating a relationship between a voltage (=VAFC_IN) of the terminal VC and the voltage VAFC in a case where a gain (R2/R1) of the AFC circuit 11 is set to be 0.4 times, 0.5 times, and 0.6 times when V1=V2=0.9V and R3=R4. For example, when a gain of the AFC circuit 11 is 0.5 times, VAFC=0.9 V±0.35 V in a case of a voltage of the terminal VC=0.9 V±0.7 V, and VAFC=1.05 V±0.5 V in a case of a voltage of the terminal VC=1.2 V±1 V.

Figure 5A:
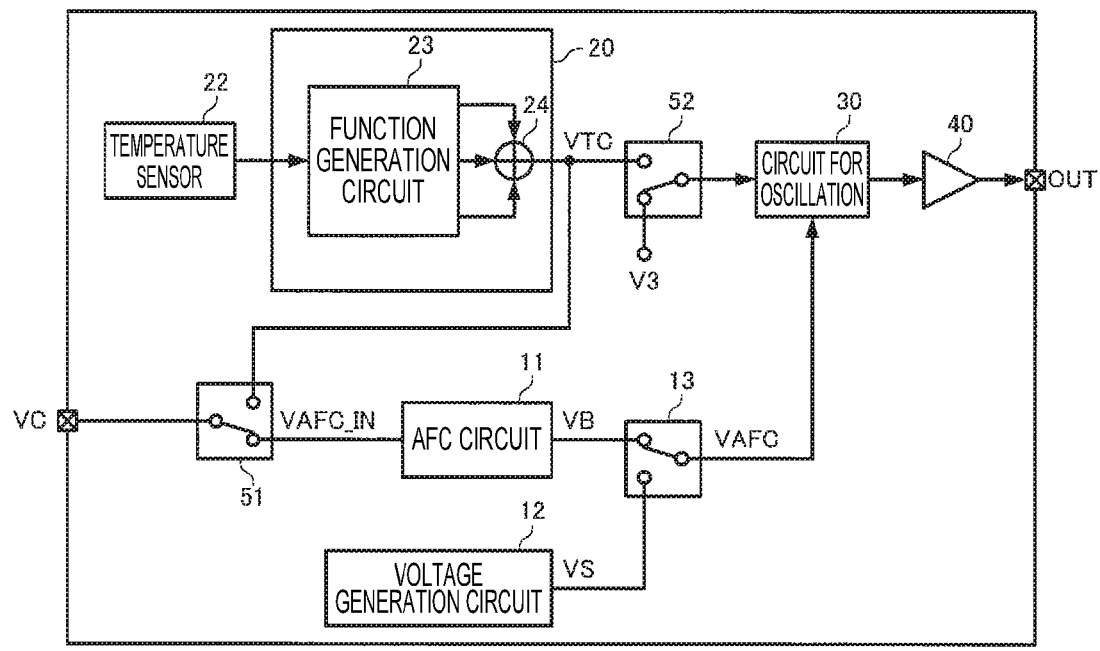
FIG. 5A is a diagram illustrating connection states of switches in a resonator characteristic measurement mode.

In addition, in the resonator characteristic measurement mode, as illustrated in FIG. 5A, the three-terminal switch 13 is set to be in the first state where the first terminal and the third terminal are electrically connected to each other, the three-terminal switch 51 is set to be in the first state where the first terminal and the third terminal are electrically connected to each other, and the three-terminal switch 52 is set to be in the second state where the second terminal and the third terminal are electrically connected to each other. Meanwhile, in FIG. 5A, some components and components inside the function generation circuit 23, the circuit for oscillation 30, the AFC circuit 11, and the voltage generation circuit 12 are not shown, but are the same as those in FIG. 3.

Accordingly, in the resonator characteristic measurement mode, the constant voltage V3 is applied to the cathode terminal of the varactor 36, and frequency-temperature characteristics of the resonator 3 are not corrected (temperature compensation). In addition, the output voltage VAFC of the AFC circuit 11 which is generated on the basis of a voltage of the terminal VC is applied to the cathode terminal of the varactor 37, and thus an oscillation frequency is controlled. Accordingly, a constant voltage is input from the terminal VC, and a frequency of an oscillation signal which is output from the terminal OUT when temperature is changed in a desired temperature range (for example, a temperature range in which an operation is guaranteed by the specification of the oscillator 1) is measured, and thus it is possible to acquire frequency-temperature characteristics of the resonator 3.

Figure 5B:
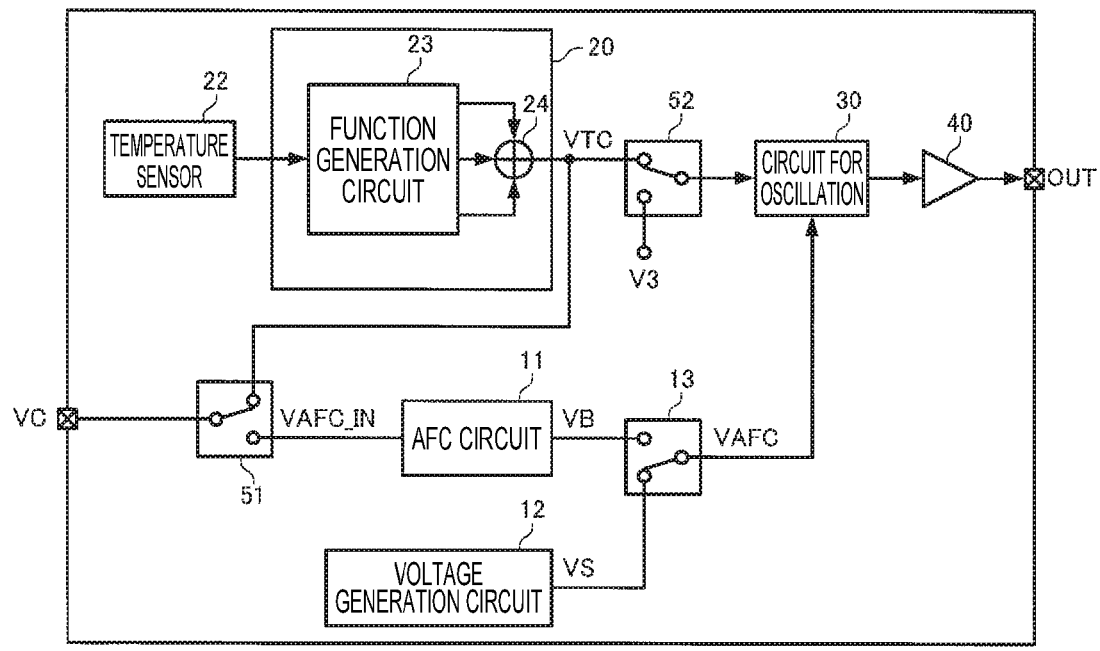
FIG. 5B is a diagram illustrating connection states of switches in a temperature compensation adjustment mode.

In addition, in the temperature compensation adjustment mode (example of a second mode), as illustrated in FIG. 5B, the three-terminal switch 13 is set to be in the second state where the second terminal and the third terminal are electrically connected to each other, the three-terminal switch 51 is set to be in the second state where the first terminal and the second terminal are electrically connected to each other, and the three-terminal switch 52 is set to be in the first state where the first terminal and the third terminal are electrically connected to each other. Meanwhile, in FIG. 5B, some components and components inside the function generation circuit 23, the circuit for oscillation 30, the AFC circuit 11, and the voltage generation circuit 12 are not shown, but are the same as those in FIG. 3.

Accordingly, in the temperature compensation adjustment mode, the output voltage VTC of the temperature compensation circuit 20 is applied to the cathode terminal of the varactor 36, and the constant voltage VS generated (selected) by the voltage generation circuit 12 is applied to the cathode terminal of the varactor 37. Accordingly, temperature is changed in a desired temperature range, the voltage VTC which is output from the terminal VC is measured to thereby obtain information of a cubic function voltage, a linear function voltage, and a constant function voltage, and frequency-temperature characteristics of the resonator 3 are corrected (compensated for), and thus it is possible to calculate a cubic coefficient, a linear coefficient, and a constant coefficient (constant) for bringing an oscillation frequency in a desired temperature range close to a target frequency.

In this manner, in the present embodiment, the circuit for oscillation 30 and the temperature compensation circuit 20 are electrically connected to each other in both the normal operation mode and the temperature compensation adjustment mode, and thus both the circuit for oscillation 30 and the temperature compensation circuit 20 operate. Accordingly, during the temperature compensation adjustment mode, it is possible to measure the voltage VTC which is output from the terminal VC while operating the circuit for oscillation 30 and the temperature compensation circuit 20 in the same state as that in the normal operation mode. Further, both the circuit for oscillation 30 and the output circuit 40, which have a large heating value, operate in both the normal operation mode and the temperature compensation adjustment mode, and thus there is a small difference between a variation in temperature during the normal operation mode and a variation in temperature during the temperature compensation adjustment mode due to heat generated by the oscillation circuit 2. Therefore, according to the present embodiment, it is possible to perform temperature compensation adjustment with a high level of accuracy.

Further, in the temperature compensation adjustment mode, a relationship between the output voltage VTC of the temperature compensation circuit 20 and an oscillation frequency can be understood also by measuring a frequency of an oscillation signal which is output from the terminal OUT, and thus it is possible to perform temperature compensation adjustment with a higher level of accuracy. Meanwhile, in the temperature compensation adjustment mode of the present embodiment, the three-terminal switch 52 has the first terminal and the third terminal connected to each other, but the invention is not limited. Even when the voltage VTC output from the terminal VC is measured in a state where the second terminal and the third terminal of the three-terminal switch 52 are connected to each other, that is, in a state where the circuit for oscillation 30 and the temperature compensation circuit 20 are not electrically connected to each other, the same effects as those described above can be exhibited.

If VS is fixed to 0.9 V irrespective of the range of a voltage input to the terminal VC in the temperature compensation adjustment mode, for example, when V1=V2=0.9 V and R3=R4, a central voltage of a voltage applied to the cathode terminal of the varactor 37 through the terminal VC during the normal operation mode coincides with a voltage applied to the cathode terminal of the varactor 37 during the temperature compensation adjustment mode when a central voltage of the terminal VC is 0.9 V during the normal operation mode like a voltage of the terminal VC=0.9 V±0.7 V. For this reason, a capacitance value of the varactor 37 in the temperature compensation adjustment mode coincides with a capacitance value of the varactor 37 when a voltage of the terminal VC1 is a central voltage in the normal operation mode, and a temperature-compensated oscillation frequency when a voltage of the terminal VC1 is a central voltage in the normal operation mode coincides with a target frequency. However, a central voltage of the terminal VC is not 0.9 V like a voltage of the terminal VC=1.2 V±1 V, a voltage applied to the cathode terminal of the varactor 37 when a voltage of the terminal VC is a central voltage 1.2 V in the normal operation mode is set to be 1.05 V, and a voltage applied to the cathode terminal of the varactor 37 during the temperature compensation adjustment mode is set to be 0.9 V, and thus voltages applied to the cathode terminal of the varactor 37 in the normal operation mode and the temperature compensation adjustment mode do not coincide with each other. For this reason, a capacitance value of the varactor 37 in the temperature compensation adjustment mode does not coincide with a capacitance value of the varactor 37 when a voltage of the terminal VC is a central voltage in the normal operation mode, and a temperature-compensated oscillation frequency when a voltage of the terminal VC is a central voltage in the normal operation mode deviates from a target frequency.

Consequently, in the present embodiment, a configuration is adopted in which the voltage VS can be selected in accordance with a selection value stored in the memory 60, and a voltage closest to a voltage applied to the cathode terminal of the varactor 37 when a voltage of the terminal VC1 is a central voltage in the normal operation mode is selected as the voltage VS applied to the cathode terminal of the varactor 37 in the temperature compensation adjustment mode, and thus a configuration in which optimal temperature compensation adjustment can be performed is adopted.

In addition, when the voltage VS applied to the varactor 37 can be finely set, a capacitance value of the varactor 37 can be adjusted more finely. In the temperature compensation adjustment mode, when a voltage step of the voltage VS applied in order to adjust a capacitance value of the varactor 37 is equal to or more than 0.1 V, a variation in the capacitance value of the varactor 37 due to a difference between a voltage applied to the varactor 37 during the temperature compensation adjustment mode and a voltage applied to the varactor 37 during the normal operation mode becomes greater, and thus it is not possible to perform optimal temperature compensation adjustment in the temperature compensation adjustment mode. For this reason, a voltage step of the voltage VS applied to the varactor 37 during the temperature compensation adjustment mode is set to be equal to or less than 0.1 V, preferably, equal to or less than 0.05 V, and thus it is possible to perform optimal temperature compensation adjustment during the temperature compensation adjustment mode.

For example, a central voltage (central voltage of VAFC_IN) of a voltage applied to the terminal VC during the normal operation mode is generally approximately 0.9 V to 1.6 V, the voltage VS when V1=V2=0.9 V, R3=R4, and a gain (R2/R1) of the AFC circuit 11 is set to be 0.5 times is set to be approximately 0.9 V to 1.25 V from Expression (3). Accordingly, in order to set a voltage step of the voltage VS to be equal to or less than 0.05 V, the voltage VS is set to be approximately 0.9 V to 1.25 V (width of 0.35 V). For this reason, when a memory amount required to set the voltage VS is set to be 3 bits (approximately 8) or more, it is possible to set the voltage step of the voltage VS to be 0.4375 V and equal to or less than 0.05 V and to perform optimal temperature compensation adjustment. Meanwhile, the above-mentioned voltage step of a central voltage of VAFC_IN, V1, V2, R1, R2, R3, and R4 are illustrated and calculated as a memory amount for setting the voltage VS. However, the invention is not limited thereto, and it is possible to appropriately set a memory amount so that a voltage step of the voltage VS is set to be equal to or less than 0.1 V, preferably equal to or less than 0.05V, in accordance with the values of a central voltage of VAFC_IN, V1, V2, R1, R2, R3, and R4.

Method of Manufacturing (Adjusting) Oscillator

Figure 7:
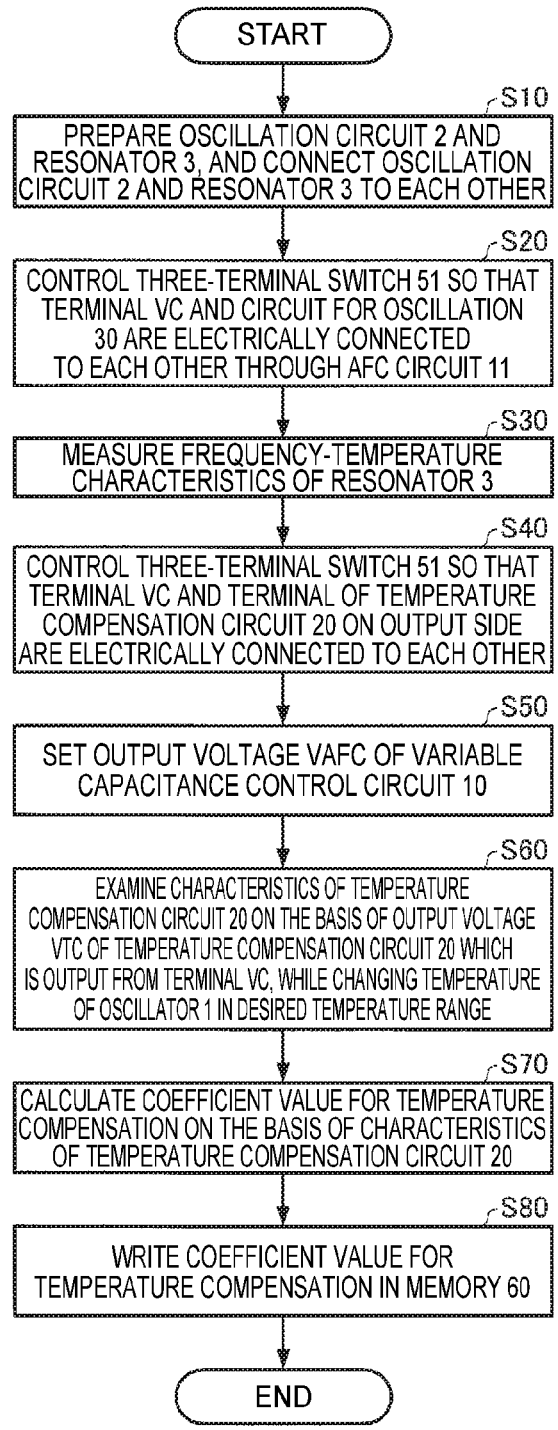
FIG. 7 is a flow chart illustrating an example of a method of manufacturing (adjusting) an oscillator according to the present embodiment.

FIG. 7 is a flow chart illustrating an example of a method of manufacturing (adjusting) an oscillator according to the present embodiment. The method of manufacturing (adjusting) an oscillator according to the present embodiment includes steps S10 to S80 illustrated in FIG. 7. However, in the method of manufacturing (adjusting) an oscillator according to the present embodiment, some of steps S10 to S80 may be omitted or changed, or other steps may be added.

As illustrated in FIG. 7, in the present embodiment, first, the oscillation circuit 2 and the resonator 3 are prepared, and the oscillation circuit 2 and the resonator 3 are electrically connected to each other (step S10).

Next, the three-terminal switch 51 is controlled so that the terminal VC and the circuit for oscillation 30 are electrically connected to each other through the AFC circuit (step S20).

Next, frequency-temperature characteristics of the resonator 3 are measured (step S30).

Next, the three-terminal switch 51 is controlled so that the terminal VC1 and a terminal of the temperature compensation circuit 20 on an output side are electrically connected to each other (step S40).

Next, the output voltage VAFC of the variable capacitance control circuit 10 is set (step S50).

Next, characteristics of the temperature compensation circuit 20 are examined on the basis of the output voltage VTC of the temperature compensation circuit 20 which is output from the terminal VC, while changing the temperature of the oscillator 1 in a desired temperature range (step S60).

Next, a coefficient value for temperature compensation is calculated on the basis of the characteristics of the temperature compensation circuit 20 which are examined in step S60 (step S70).

Next, the coefficient value for temperature compensation which is obtained in step S70 is written in the memory 60 (step S80).

Figure 8:
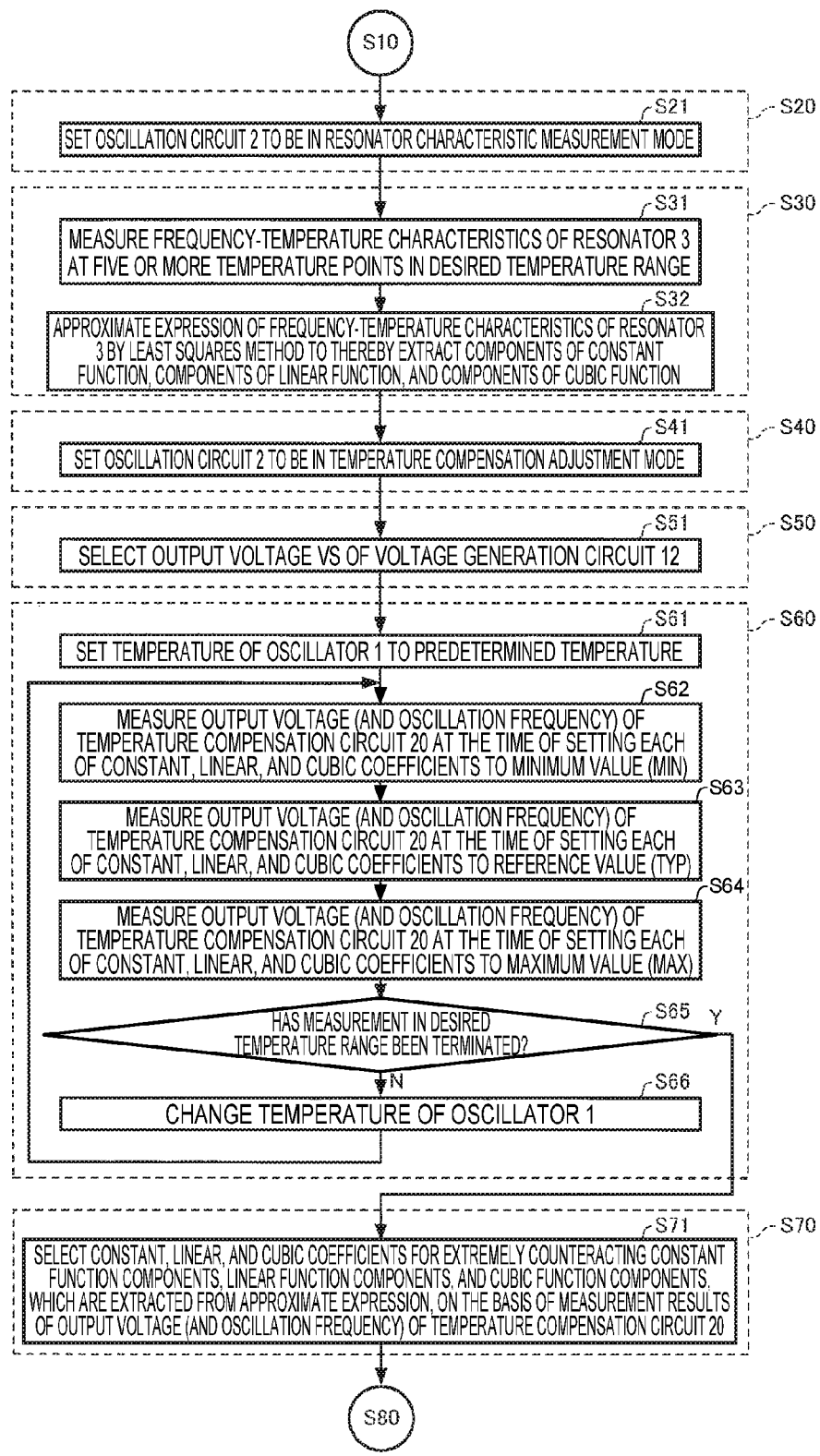
FIG. 8 is a detailed flow chart of steps S20 to S70 of FIG. 7.

FIG. 8 is a detailed flow chart of steps S20 to S70 of FIG. 7. As illustrated in FIG. 8, in the present embodiment, the oscillation circuit 2 is set to be in a resonator characteristic measurement mode as step S20 (S21). Thereby, the three-terminal switch 13, the three-terminal switch 51, and the three-terminal switch 52 are set to be in a connection state as illustrated in FIG. 5A.

In addition, first, frequency-temperature characteristics of the resonator 3 at five or more temperature points in a desired temperature range are measured as step S30 (S31). Specifically, for example, the oscillator 1 is accommodated in a thermostatic chamber, and the frequency of each of oscillation signals which are output from the external terminal OUT1 at five or more temperature points is measured while changing the temperature of the thermostatic chamber in a state where a central voltage during the normal operation mode is applied to the external terminal VC1.

Next, an expression of the frequency-temperature characteristics of the resonator 3 which are obtained by the measurement in step S31 is approximated by the least squares method to thereby extract components of a constant function, components of a linear function, and components of a cubic function (S32).

In addition, as step S40, the oscillation circuit 2 is set to be in the temperature compensation adjustment mode (S41). Thereby, the three-terminal switch 13, the three-terminal switch 51, and the three-terminal switch 52 are set to be in a connection state as illustrated in FIG. 5B, and thus electrical connection between the terminal VC and the AFC circuit 11 is cut off, and the terminal VC and an output terminal of the temperature compensation circuit 20 are electrically connected to each other.

In addition, as step S50, the output voltage VS of the voltage generation circuit 12 is selected (S51). Specifically, a selection value in which the voltage VS becomes closest to the voltage VB calculated from Expressions (1) and (2) is written in the memory 60 in a state where a central voltage of the terminal VC during the normal operation mode is set to be VAFC_IN. For example, when V1=V2=0.9 V, R3=R4, and R2/R1=0.5, a selection value in which VS becomes closest to 0.9 V is written in a case where a central voltage of the terminal VC during the normal operation mode is 0.9 V, and a selection value in which VS becomes closest to 1.05 V is written in a case where a central voltage of the terminal VC during the normal operation mode is 1.2 V.

In addition, as step S60, first, the temperature of the oscillator 1 is set to a predetermined temperature (S61). Specifically, for example, the temperature of the thermostatic chamber accommodating the oscillator 1 is set to any of a plurality of temperatures to be measured which are included in a desired temperature range.

Next, an output voltage (and an oscillation frequency) of the temperature compensation circuit 20 at the time of setting each of constant, linear, and cubic coefficients to a minimum value (MIN) is measured (S62). Specifically, the linear coefficient and the cubic coefficient are set to 0, the constant coefficient is set to a minimum value (MIN), the output voltage VTC (and a frequency of an oscillation signal which is output from the external terminal OUT1) of the temperature compensation circuit 20 which is output from the external terminal VC1 is measured. In addition, the constant coefficient and the cubic coefficient are set to 0, the linear coefficient is set to a minimum value (MIN), and the output voltage VTC (and a frequency of an oscillation signal which is output from the external terminal OUT1) of the temperature compensation circuit 20 which is output from the external terminal VC1 is measured. In addition, the constant coefficient and the linear coefficient are set to 0, the cubic coefficient is set to a minimum value (MIN), and the output voltage VTC (and a frequency of an oscillation signal which is output from the external terminal OUT1) of the temperature compensation circuit 20 which is output from the external terminal VC1 is measured.

Next, an output voltage (and an oscillation frequency) of the temperature compensation circuit 20 at the time of setting each of constant, linear, and cubic coefficients to a reference value (TYP) is measured (S63). Specifically, the linear coefficient and the cubic coefficient are set to 0, the constant coefficient is set to a reference value (TYP), and the output voltage VTC (and a frequency of an oscillation signal which is output from the external terminal OUT1) of the temperature compensation circuit 20 which is output from the external terminal VC1 is measured. In addition, the constant coefficient and the cubic coefficient are set to 0, the linear coefficient is set to a reference value (TYP), and the output voltage VTC (and a frequency of an oscillation signal which is output from the external terminal OUT1) of the temperature compensation circuit 20 which is output from the external terminal VC1 is measured. In addition, the constant coefficient and the linear coefficient are set to 0, the cubic coefficient is set to a reference value (TYP), and the output voltage VTC (and a frequency of an oscillation signal which is output from the external terminal OUT1) of the temperature compensation circuit 20 which is output from the external terminal VC1 is measured.

Next, an output voltage (and an oscillation frequency) of the temperature compensation circuit 20 at the time of setting each of constant, linear, and cubic coefficients to a maximum value (MAX) is measured (S64). Specifically, the linear coefficient and the cubic coefficient are set to 0, the constant coefficient is set to a maximum value (MAX), the output voltage VTC (and a frequency of an oscillation signal which is output from the external terminal OUT1) of the temperature compensation circuit 20 which is output from the external terminal VC1 is measured. In addition, the constant coefficient and the cubic coefficient are set to 0, the linear coefficient is set to a maximum value (MAX), and the output voltage VTC (and a frequency of an oscillation signal which is output from the external terminal OUT1) of the temperature compensation circuit 20 which is output from the external terminal VC1 is measured. In addition, the constant coefficient and the linear coefficient are set to 0, the cubic coefficient is set to a maximum value (MAX), and the output voltage VTC (and a frequency of an oscillation signal which is output from the external terminal OUT1) of the temperature compensation circuit 20 which is output from the external terminal VC1 is measured.

Next, when measurement at each of the plurality of temperatures to be measured which are included in a desired temperature range has not been terminated (N in S65), the temperature of the oscillator 1 is changed to an unmeasured temperature (S66), and step S62 and the subsequent steps are performed again.

When measurement at each of the plurality of temperatures to be measured which are included in a desired temperature range has been terminated (Y in S65), constant, linear, and cubic coefficients for extremely counteracting the constant function components, the linear function components, and the cubic function components, which are extracted from the approximate expression in step S32, are selected on the basis of the measurement results in steps S61 to S66, as step S70 (S71). Specifically, an expression of a constant function voltage when a constant coefficient is set to each of a minimum value (MIN), a reference value (TYP), and a maximum value (MAX) is calculated from the measurement results of the output voltage VTC (and an oscillation frequency) of the temperature compensation circuit 20 in steps S61 to S66, and a constant coefficient value in which a constant function voltage extremely counteracts the constant function components extracted in step S32 is selected on the basis of the calculation results. Similarly, an expression of a linear function voltage when a linear coefficient is set to each of a minimum value (MIN), a reference value (TYP), and a maximum value (MAX) is calculated from the measurement results of the output voltage VTC (and an oscillation frequency) of the temperature compensation circuit 20 in steps S61 to S66, and a linear coefficient value in which a linear function voltage extremely counteracts the linear function components extracted in step S32 is selected on the basis of the calculation results. Similarly, an expression of a cubic function voltage when a cubic coefficient is set to each of a minimum value (MIN), a reference value (TYP), and a maximum value (MAX) is calculated from the measurement results of the output voltage VTC (and an oscillation frequency) of the temperature compensation circuit 20 in steps S61 to S66, and a cubic coefficient value in which a cubic function voltage extremely counteracts the cubic function components extracted in step S32 is selected on the basis of the calculation results.

Meanwhile, since the constant function voltage does not change depending on the temperature of the oscillator 1, the output voltage VTC (and an oscillation frequency) of the temperature compensation circuit 20 at the time of setting a constant coefficient to each of a minimum value (MIN), a reference value (TYP), and a maximum value (MAX) may be measured in steps S62, S63, and S64 at only one of a plurality of temperatures.

As described above, according to the present embodiment, an oscillation frequency of the oscillator 1 (oscillation circuit 2) can be adjusted on the basis of an output signal of the temperature compensation circuit 20 which is output from the terminal VC in the temperature compensation adjustment mode in a state where the circuit for oscillation 30 and the temperature compensation circuit 20 operate, and thus it is possible to reduce a concern for a fluctuation in an oscillation frequency (frequency-temperature characteristics) in the normal operation mode after the adjustment.

In particular, according to the present embodiment, an oscillation frequency of the oscillator 1 (oscillation circuit 2) can be adjusted in the temperature compensation adjustment mode in a state where the output circuit 40 operates similar to in the normal operation mode, and thus there is a small difference in noise or heat generated from the output circuit 40 in the normal operation mode and the temperature compensation adjustment mode. In addition, it is possible to adjust oscillation frequency more accurately while directly measuring the frequency of an oscillation signal which is output from the terminal OUT in the temperature compensation adjustment mode. Accordingly, it is possible to further reduce a concern for a fluctuation in an oscillation frequency (frequency-temperature characteristics) in the normal operation mode after the adjustment and to provide the oscillator with satisfactory frequency-temperature characteristics. Meanwhile, as the output circuit 40 of the present embodiment, for example, a circuit that outputs a clipped sine waveform or a CMOS output circuit may be used. Since the CMOS output circuit has a heating value larger than that of the circuit that outputs a clipped sine waveform, it is possible to further exhibit effects in the above-described embodiment when the CMOS output circuit is used for the output circuit 40.

In addition, according to the present embodiment, in the temperature compensation adjustment mode, a voltage generated by the voltage generation circuit 12 is input to the circuit for oscillation 30 instead of an output voltage of the AFC circuit 11 which is input to the circuit for oscillation 30 in the normal operation mode, and thus it is possible to reduce a difference in the state of the circuit for oscillation 30 between the temperature compensation adjustment mode and the normal operation mode. In more detail, in the temperature compensation adjustment mode, temperature compensation adjustment can be performed in a state where an output voltage of the voltage generation circuit 12 is set to be a voltage closest to the output voltage VB of the AFC circuit 11 when a central voltage is applied to the terminal VC during the normal operation mode. Thereby, temperature compensation adjustment can be performed in a state where a voltage applied to the varactor 37 is closest to a voltage applied to the varactor 37 when a central voltage is applied to the terminal VC during the normal operation mode, that is, in a state where a capacitance value of the varactor 37 substantially coincides with a capacitance value when a central voltage is applied to the terminal VC during the normal operation mode, and thus it is possible to reduce an error of the temperature compensation adjustment. Therefore, according to the present embodiment, it is possible to further reduce a concern for a fluctuation in an oscillation frequency (frequency-temperature characteristics) in the normal operation mode after the adjustment and to provide the oscillator with satisfactory frequency-temperature characteristics.

2. Electronic Apparatus

Figure 9:
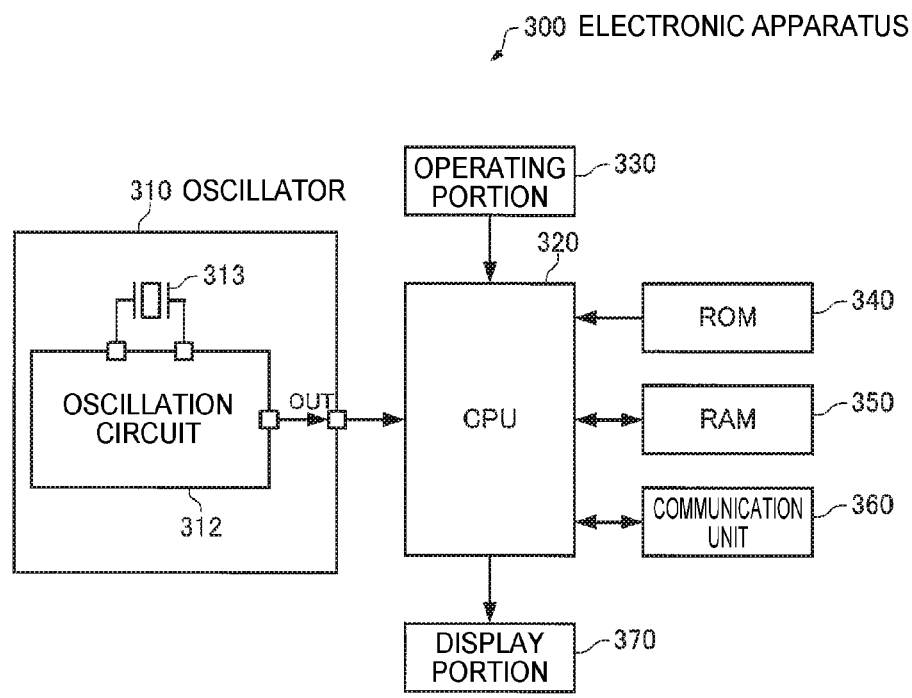
FIG. 9 is a functional block diagram illustrating an example of a configuration of an electronic apparatus according to the present embodiment.
Figure 10:
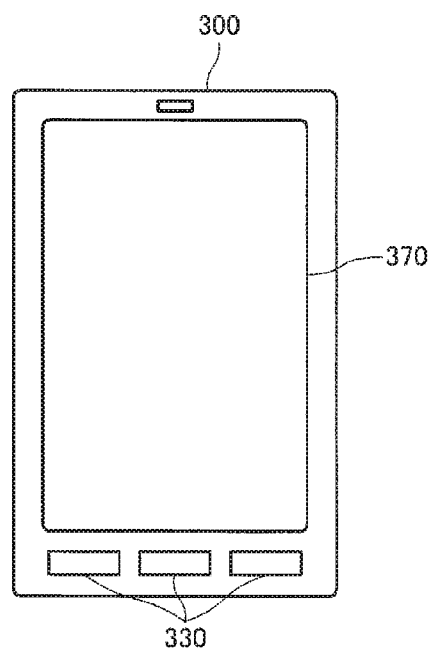
FIG. 10 is a diagram illustrating an example of an exterior of the electronic apparatus according to the present embodiment.

FIG. 9 is a functional block diagram illustrating an example of a configuration of an electronic apparatus according to the present embodiment. In addition, FIG. 10 is a diagram illustrating an example of the exterior of a smartphone which is an example of the electronic apparatus according to the present embodiment.

An electronic apparatus 300 according to the present embodiment is configured to include an oscillator 310, a central processing unit (CPU) 320, an operating portion 330, a read only memory (ROM) 340, a random access memory (RAM) 350, a communication unit 360, and a display portion 370. Meanwhile, the electronic apparatus according to the present embodiment may have a configuration in which some of components (respective portions) of FIG. 9 are omitted or changed, or may have a configuration in which other components are added.

The oscillator 310 includes an oscillation circuit 312 and a resonator 313. The oscillation circuit 312 generates an oscillation signal by oscillating the resonator 313. The oscillation signal is output to the CPU 320 from a terminal OUT of the oscillator 310.

The CPU 320 performs various types of computation processes and control processes using the oscillation signal which is output from the oscillator 310 as a clock signal, in accordance with a program stored in the ROM 340 or the like. Specifically, the CPU 320 performs various types of processes in response to an operation signal from the operating portion 330, a process of controlling the communication unit 360 in order to perform data communication with an external device, and a process of transmitting a display signal for causing the display portion 370 to display a variety of information.

The operating portion 330 is an input device constituted by operation keys, button switches or the like, and outputs an operation signal in response to a user's operation to the CPU 320.

The ROM 340 stores programs, data or the like for causing the CPU 320 to perform various types of computation processes and control processes.

The RAM 350 is used as a work area of the CPU 320, and temporarily stores programs and data which are read out from the ROM 340, data which is input from the operating portion 330, arithmetic operation results executed by the CPU 320 in accordance with various types of programs, and the like.

The communication unit 360 performs a variety of control for establishing data communication between the CPU 320 and an external device.

The display portion 370 is a display device constituted by a liquid crystal display (LCD) or the like, and displays a variety of information on the basis of a display signal which is input from the CPU 320. The display portion 370 may be provided with a touch panel functioning as the operating portion 330.

For example, the oscillation circuit 2 according to the above-described embodiment is used as the oscillation circuit 312, or the oscillator 1 according to the above-described embodiment is used as the oscillator 310, and thus it is possible to realize the electronic apparatus with high reliability.

Various electronic apparatuses are considered as the electronic apparatus 300, and examples of the electronic apparatus include a personal computer (for example, mobile-type personal computer, laptop personal computer, or tablet personal computer), a mobile terminal such as a smartphone or a mobile phone, a digital camera, an ink jet ejecting apparatus (for example, ink jet printer), a storage area network device such as a router or a switch, a local area network device, a device for abase station of a mobile terminal, a television, a video camera, a video tape recorder, a car navigation device, a real-time clock device, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish detector, various types of measuring apparatuses, meters and gauges (for example, meters and gauges of a vehicle, an aircraft, and a vessel), a flight simulator, a head mounted display, a motion tracer, a motion tracker, a motion controller, PDR (walker position and direction measurement), and the like.

An example of the electronic apparatus 300 according to the present embodiment includes a transmission device functioning as a device for a base station of a terminal which performs communication with a terminal, for example, in a wired or wireless manner using the oscillator 310 mentioned above as a reference signal source, a voltage variable oscillator (VCO), or the like. The electronic apparatus 300 according to the present embodiment can also be applied to a transmission device, desired to have high performance and high reliability, which is capable of being used in, for example, a communication base station by using, for example, the oscillator 1 according to the above-described embodiment as the oscillator 310.

3. Moving Object

Figure 11:
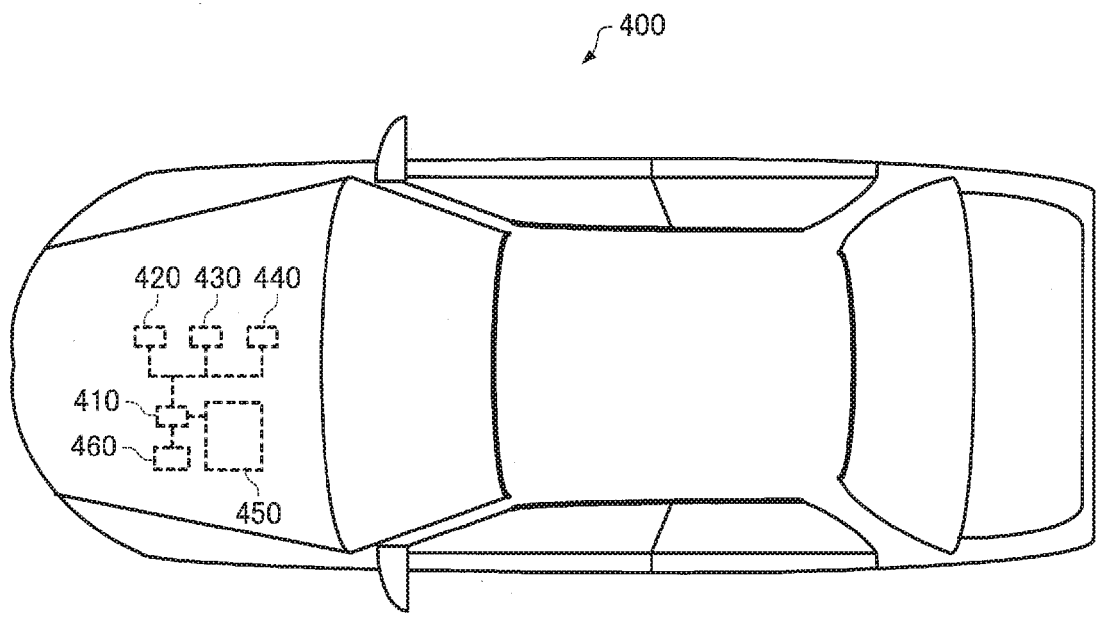
FIG. 11 is a diagram illustrating an example of a moving object according to the present embodiment.

FIG. 11 is a diagram (top view) illustrating an example of a moving object according to the present embodiment. A moving object 400 illustrated in FIG. 11 is configured to include an oscillator 410, controllers 420, 430, and 440 that perform a variety of control of an engine system, a brake system, a keyless entry system and the like, a battery 450, and a battery 460 for backup. Meanwhile, the moving object of the present embodiment may have a configuration in which some of the components (the respective portions) of FIG. 11 are omitted, and may have a configuration in which other components are added.

The oscillator 410 includes an oscillation circuit and a resonator which are not shown in the drawing, and the oscillation circuit generates an oscillation signal by oscillating the resonator. The oscillation signal is output to the controllers 420, 430, and 440 from an external terminal of the oscillator 410, and is used as, for example, a clock signal.

The battery 450 supplies power to the oscillator 410 and the controllers 420, 430, and 440. The battery 460 for backup supplies power to the oscillator 410 and the controllers 420, 430, and 440 when an output voltage of the battery 450 becomes lower than a threshold value.

For example, the oscillation circuit 2 according to the above-described embodiment is used as the oscillation circuit included in the oscillator 410, or the oscillator 1 according to the above-described embodiment is used as the oscillator 410, and thus it is possible to realize the moving object with high reliability.

Various moving objects are considered as the moving object 400. Examples of the moving object include an automobile (also including an electric automobile), an aircraft such as a jet engine airplane or a helicopter, a vessel, a rocket, a satellite, and the like.

The invention is not limited to the present embodiment, and various changes and modifications can be made without departing from the scope of the invention.

For example, the oscillator according to the above-described embodiment is an oscillator (voltage controlled temperature compensated crystal oscillator (VC-TCXO))

which has a temperature compensation function and a voltage control function (frequency control function), or the like. However, the invention can also be applied to oscillators such as a voltage-controlled oscillator (voltage controlled crystal oscillator (VCXO) or the like) which does not have a temperature compensation function, a temperature compensated oscillator (temperature compensated crystal oscillator (TCXO) or the like) which does not have a voltage control function (frequency control function), an oscillator (simple packaged crystal oscillator (SPXO) or the like) which does not have both a temperature compensation function and a voltage control function (frequency control function), and a thermostatic chamber type oscillator (oven controlled crystal oscillator (OCXO) or the like).

Each of the above-described embodiments is an example, and is not limited thereto. For example, the embodiments can also be appropriately combined.

The invention includes configurations (for example, configurations having the same functions, methods and results, or configurations having the objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2015-029614, filed Feb. 18, 2015 is expressly incorporated by reference herein.

What is claimed is:

1. An oscillation circuit comprising:
a circuit for oscillation which is electrically connected to a resonator and oscillates the resonator;
a first frequency adjustment circuit that adjusts a frequency of the circuit for oscillation, the first frequency adjustment circuit having an output terminal that outputs a signal of the first frequency adjustment circuit;
a second frequency adjustment circuit that adjusts the frequency of the circuit for oscillation;
a first terminal that is an external terminal that receives a signal for controlling the oscillation circuit; and
a voltage generation circuit that is capable of variably setting a voltage to be output,
wherein the oscillation circuit has
a first mode in which the second frequency adjustment circuit and the circuit for oscillation are electrically connected to each other, the voltage generation circuit and the circuit for oscillation are not electrically connected to each other, the first terminal and the second frequency adjustment circuit are electrically connected to each other, the first frequency adjustment circuit and the first terminal are not electrically connected to each other, and the frequency of the circuit for oscillation is controlled by output signals of the first frequency adjustment circuit and the second frequency adjustment circuit, and
a second mode in which the voltage generation circuit and the circuit for oscillation are electrically connected to each other, the second frequency adjustment circuit and the circuit for oscillation are not electrically connected to each other, the first terminal and the output terminal of the first frequency adjustment circuit are electrically connected to each other, the first terminal and the second frequency adjustment circuit are not electrically connected to each other, and the frequency of the circuit for oscillation is controlled by output signals of the first frequency adjustment circuit and the voltage generation circuit.

2. The oscillation circuit according to claim 1, further comprising:
an output circuit that has a signal which is output from the circuit for oscillation and is input thereto, to thereby output an oscillation signal,
wherein the output circuit operates in the first mode and the second mode.

3. The oscillation circuit according to claim 2, further comprising a second terminal that is electrically connected to a terminal on an output side of the output circuit.

4. The oscillation circuit according to claim 1, further comprising: a voltage generation circuit that is capable of variably setting a voltage to be output.

5. The oscillation circuit according to claim 1, further comprising:
a temperature-sensitive element,
wherein the first frequency adjustment circuit adjusts the frequency of the circuit for oscillation based on a signal which is output from the temperature-sensitive element.

6. An electronic apparatus comprising the oscillation circuit according to claim 1.

7. An electronic apparatus comprising the oscillation circuit according to claim 2.

8. An electronic apparatus comprising the oscillation circuit according to claim 3.

9. An electronic apparatus comprising the oscillation circuit according to claim 4.

10. An electronic apparatus comprising the oscillation circuit according to claim 5.

11. A moving object comprising the oscillation circuit according to claim 1.

12. A moving object comprising the oscillation circuit according to claim 2.

13. A moving object comprising the oscillation circuit according to claim 3.

14. A moving object comprising the oscillation circuit according to claim 4.

15. A moving object comprising the oscillation circuit according to claim 5.

16. A method of adjusting an oscillation circuit including a circuit for oscillation which is electrically connected to a resonator and oscillates the resonator: a first frequency adjustment circuit that adjusts a frequency of the circuit for oscillation, the first frequency adjustment circuit having an output terminal that outputs a signal of the first frequency adjustment circuit; a second frequency adjustment circuit that adjusts the frequency of the circuit for oscillation; a first terminal that is an external terminal that receives a signal for controlling the oscillation circuit; and a voltage generation circuit that is capable of variably setting a voltage to be output, the oscillation circuit having (1) a first mode in which the second frequency adjustment circuit and the circuit for oscillation are electrically connected to each other, the voltage generation circuit and the circuit for oscillation are not electrically connected to each other, the first terminal and the second frequency adjustment circuit are electrically connected to each other, the first frequency adjustment circuit and the first terminal are not electrically connected to each other, and the frequency of the circuit for oscillation is controlled by output signals of the first frequency adjustment circuit and the second frequency adjustment circuit, and (2) a second mode in which the voltage generation circuit and the circuit for oscillation are electrically connected to each other, the second frequency adjustment circuit and the circuit for oscillation are not electrically connected to each other, the first terminal and the first frequency adjustment circuit are electrically connected to each other, the first terminal and the output terminal of the second frequency adjustment circuit are not electrically connected to each other, and the frequency of the circuit for oscillation is controlled by output signals of the first frequency adjustment circuit and the voltage generation circuit, the method comprising: setting the oscillation circuit to be in the second mode; and adjusting the circuit for oscillation based on the signal of the first frequency adjustment circuit and an output from the first terminal in a state where the oscillation circuit is set to be in the second mode.

17. The oscillation circuit according to claim 4, further comprising: a memory storing data for adjusting the voltage outputted from the voltage generation circuit.

18. The oscillation circuit according to claim 17, wherein the data has a size equal to or larger than 3 bits.

* * * * *